(12) United States Patent
Bartulec et al.

(10) Patent No.: US 9,374,891 B2
(45) Date of Patent: Jun. 21, 2016

(54) INJECTION MOULDED CIRCUIT CARRIER HAVING AN INTEGRATED CIRCUIT BOARD

(75) Inventors: Roman Bartulec, Buckenhof (DE); Holger Kral, Fürth (DE); Frank Naumann, Bubenreuth (DE)

(73) Assignee: Sivantos Pte. Ltd., Singapore (SG)

( * ) Notice: Subject to any disclaimer, the term of this patent is extended or adjusted under 35 U.S.C. 154(b) by 0 days.

(21) Appl. No.: 14/410,280

(22) PCT Filed: Jun. 20, 2012

(86) PCT No.: PCT/EP2012/061805
§ 371 (c)(1),
(2), (4) Date: Feb. 17, 2015

(87) PCT Pub. No.: WO2013/189531
PCT Pub. Date: Dec. 27, 2013

(65) Prior Publication Data
US 2015/0208497 A1    Jul. 23, 2015

(51) Int. Cl.
*H05K 1/02* (2006.01)
*H04R 1/08* (2006.01)
*H05K 1/14* (2006.01)
*H04R 25/00* (2006.01)

(52) U.S. Cl.
CPC ............... *H05K 1/0284* (2013.01); *H04R 1/08* (2013.01); *H04R 25/00* (2013.01); *H04R 25/60* (2013.01); *H05K 1/142* (2013.01); *H05K 2201/0999* (2013.01); *H05K 2201/09118* (2013.01); *H05K 2201/10083* (2013.01)

(58) Field of Classification Search
CPC ........ H04R 25/00; H04R 25/60; H04R 25/65; H04R 2225/023; H04R 2225/025
USPC .......................... 381/312, 314, 322–324, 328
See application file for complete search history.

(56) References Cited

U.S. PATENT DOCUMENTS

| | | | |
|---|---|---|---|
| 4,891,687 | A | 1/1990 | Mallik et al. |
| 5,679,976 | A | 10/1997 | Nishikawa et al. |
| 6,490,168 | B1 | 12/2002 | Rochowicz et al. |
| 7,971,337 | B2 | 7/2011 | Kral et al. |
| 2003/0214026 | A1 | 11/2003 | Tokuhara |
| 2005/0117763 | A1 | 6/2005 | Svendsen et al. |
| 2006/0233412 | A1 | 10/2006 | Niederdrank et al. |

(Continued)

FOREIGN PATENT DOCUMENTS

| | | |
|---|---|---|
| DE | 102006017630 A1 | 10/2007 |
| DE | 102008038212 A1 | 12/2009 |

(Continued)

*Primary Examiner* — Suhan Ni
(74) *Attorney, Agent, or Firm* — Laurence A. Greenberg; Werner H. Stemer; Ralph E. Locher

(57) ABSTRACT

An electronic unit has a circuit board that is integrated into an injection molded circuit carrier. A hearing aid is provided with such an electronic unit. In order to reduce the complexity and size of an electronic unit with an injection molded circuit carrier and a circuit board, the circuit board is integrated into the injection molded circuit carrier by introducing the circuit board into the plastic mold such that the surface of a first side of the circuit board lies within the plastic mold and the surface of a second side of the circuit board is substantially flush with the surface of the plastic mold. At least one conductive track of the circuit board is electrically conductively connected to at least one conductive track of the injection molded circuit carrier.

11 Claims, 2 Drawing Sheets

(56) References Cited

U.S. PATENT DOCUMENTS

2007/0247822 A1 10/2007 Naundorf
2011/0083894 A1 4/2011 Kopf

FOREIGN PATENT DOCUMENTS

| DE | 102008035420 A1 | 2/2010 |
| DE | 102009054236 A1 | 5/2011 |
| EP | 1317163 A2 | 6/2003 |
| EP | 1662635 A2 | 5/2006 |

INJECTION MOULDED CIRCUIT CARRIER HAVING AN INTEGRATED CIRCUIT BOARD

BACKGROUND OF THE INVENTION

Field of the Invention

The invention relates to an electronic unit having a circuit board integrated into an injection-molded circuit carrier and to a hearing aid having such an electronic unit.

An injection-molded circuit carrier, also known as a "molded interconnect device" (MID) comprises an injection-molded solid plastic molded part, the surface of which is provided with conductive tracks. In principle, the injection-molding process enables the shape of the plastic molded part to be selected as desired. This means injection-molded circuit carriers are extremely suitable for a particularly compact design of electrical circuits. An injection-molded circuit carrier can be connected conductively to further electronic components, in particular a circuit board, and together with these forms an electronic unit. A compact design of an electronic unit with a circuit board is needed in many technological fields, for example electrical motors, cellular telephones and hearing aids. A hearing aid amplifies acoustic signals and this requires a plurality of electronic components. All the electronic components have to be packed into a small volume since the housing of the hearing aid has to be as small as possible for cosmetic reasons. In addition, the production of an electronic unit, in particular a hearing aid, should incur the lowest possible costs.

Known from EP 1 662 635 A2 is an electric machine comprising a transmission case for retaining transmission components and a circuit board, wherein the transmission case is made of a plastic material and conductive tracks are integrated in the transmission case in order to provide an electrical connection with the circuit board, wherein the conductive track is integrated into the transmission case by means of MID technology, wherein contact surfaces are arranged on at least one of the narrow side surfaces of the circuit board.

BRIEF SUMMARY OF THE INVENTION

It is the object of the invention to reduce the complexity and size of an electronic unit comprising an injection-molded circuit carrier and a circuit board.

The object is achieved by a device as claimed.

The invention is based on the idea of integrating a circuit board into an injection-molded circuit carrier in the form of a solid plastic molded part with electrically conductive tracks on the surface of the plastic molded part in that the circuit board is introduced into the plastic molded part such that the surface of a side of the circuit board lies within the plastic molded part and the surface of a side of the circuit board is substantially flush with the surface of the plastic molded part and in that at least one conductive track of the circuit board is electrically conductively connected to at least one conductive track of the injection-molded circuit carrier. This simplifies the complexity and size of the electronic unit and simplifies the production thereof.

In a further embodiment, the conductive track of the circuit board and the conductive track of the injection-molded circuit carrier are connected by soldering and/or with the aid of an electrically conductive adhesive as a result of which the connection has particularly high electrical Conductivity and robustness.

In a further embodiment, the circuit board is fastened to the plastic molded part with the aid of a chemical or mechanical fixing means as a result of which the circuit board is connected to the plastic molded part in a particularly robust manner.

In a further embodiment, an electronic component is installed directly on the plastic molded part and electrically conductively connected to a conductive track of the injection-molded circuit carrier. This procedure enables the electronic unit to have a highly integrated and compact design as result of which its production is also simplified.

In a further embodiment, at least one surface-mountable component is installed on the circuit board and electrically conductively connected thereto as a result of which the integration level of the electronic unit is further increased.

In a further embodiment, at least one surface-mountable component is an integrated circuit as a result of which it is possible also to connect integrated circuits with electrical contacts lying very close together electrically conductively to an injection-molded circuit carrier in a simple manner.

In a further embodiment, the circuit board with the integrated circuit is embodied as an amplifier as a result of which the electronic unit can perform the function of an amplifier, in particular in a hearing aid.

In a further embodiment, at least one microphone is installed directly on the plastic molded part and electrically conductively connected to a conductive track of the injection-molded circuit carrier as a result of which the electronic unit can be used as a microphone module, in particular in a hearing aid.

In a further embodiment, at least one loudspeaker is installed directly on the plastic molded part and electrically conductively connected to a conductive track of the injection-molded circuit carrier as a result of which the electronic unit can be used as a loudspeaker module, in particular in a hearing aid.

A further embodiment entails a hearing aid comprising an electronic unit in one of the above-named embodiments as a result of which the integration level of the hearing aid is increased and it can be constructed in a particularly compact form.

In a further embodiment, the plastic molded part of the electronic unit is embodied as a part of the housing of the hearing aid. The dual function of the injection-molded circuit carrier as a housing and as an essential component of the electronic unit enables the hearing aid to have a particularly compact design.

BRIEF DESCRIPTION OF THE SEVERAL VIEWS OF THE DRAWING

The invention is described and explained below in more detail with reference to the exemplary embodiments in the figures.

In the figures.

DESCRIPTION OF THE INVENTION

Figure 1:
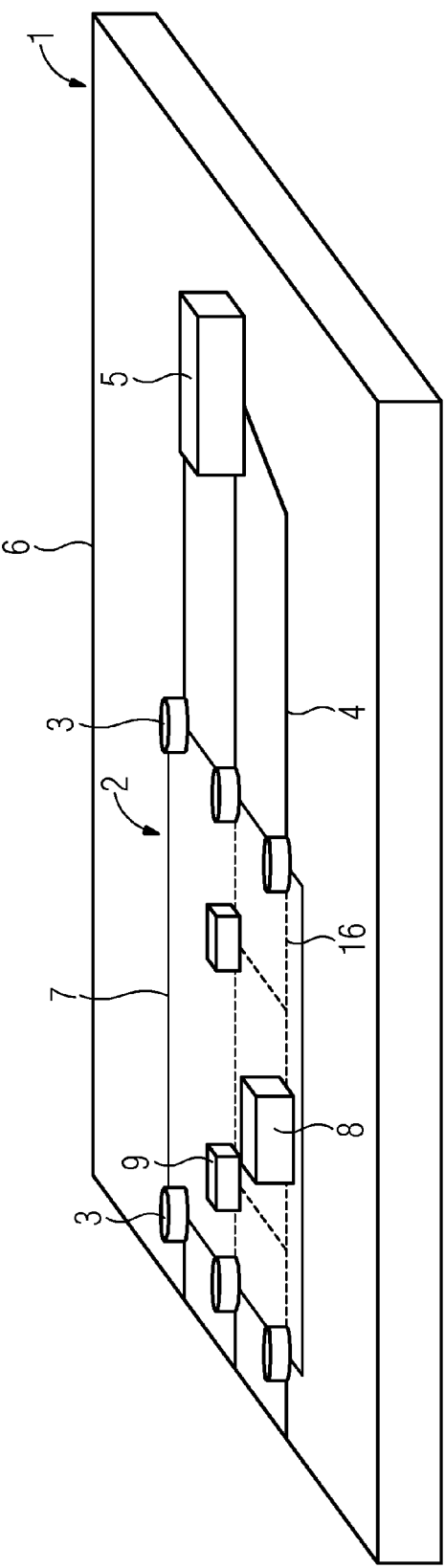
FIG. 1 shows an integrated electronic unit in a top view.

FIG. 1 shows an integrated electronic unit 2 in a top view comprising the following components: an integrated circuit 8 installed on a circuit board 7, surface-mountable components 9 which are also installed on the circuit board 7, and an injection-molded circuit carrier 1 in the form of a solid plastic molded part 6 with conductive tracks 4 on the surface of the plastic molded part 6. The circuit board 7 is introduced into the plastic molded part 6 and electrically conductively connected to conductive tracks 4 of the injection-molded circuit carrier 1 by soldering tin 3. In addition, a microphone 5 is installed on the plastic molded part 6 and electrically conductively connected to a conductive track 4 of the injection-molded circuit carrier 1 so that the electrical signals coming from the microphone 5 are routed to the electronic unit 2 where they can be processed.

The component referred to here as electronic unit 2 is generally a signal processing unit, which filters and amplifies the signals coming from the microphone 5 in order then to route them to the loudspeaker 18. In the embodiment shown here, therefore, the electronic unit 2 can also be referred to as an amplifier. An amplifier of this kind typically comprises at least one integrated circuit 8. The integrated circuit 8 can, for example, be electrically connected to the circuit board 7 using flip-chip technology or wire bonding.

In addition to the integrated circuit 8, further surface-mountable components 9 can be installed on the circuit board 7 and electrically conductively connected thereto, for example, resistances, capacitors or inductances. The connection of additional components to the integrated circuit 8 enables greater flexibility in the design of the properties of the amplifiers. However, it is also possible to install microphones 5, loudspeakers 18, coils or other components on the circuit board 7.

Introducing the circuit board 7 into the plastic molded part 6 makes it possible to connect the circuit board 7 electrically conductively to the conductive tracks 4 of the injection-molded circuit carrier 1 in a particularly simple way. To connect the circuit board 7 electrically to the injection-molded circuit carrier 1, at least one conductive track of the circuit board 16 is electrically conductively connected to at least one conductive track 4 installed on the surface of the plastic molded part 6. This connection can, for example, be established by soldering tin 3 or with the aid of an electrically conductive adhesive. Therefore, no wire or cable connection is required between the circuit board 7 and the conductive tracks 4 of the injection-molded circuit carrier 1.

Here, the circuit board 7 is introduced in the plastic molded part 6 such that the surface of a side of the circuit board 7 is substantially flush with the surface of the plastic molded part 6 along one side of the circuit board 7. The surface of the circuit board 7 then lies substantially in a plane with the directly adjacent surface of the injection-molded circuit carrier 1. The flush mounting of the circuit board 7 enables it to be electrically conductively connected to the conductive tracks 4 in a particularly simple way. In particular a butt soldered connection, i.e. with no overlapping or penetration of the parts to be soldered is possible without difficulty here since the soldered connection is only exposed to low stresses. For example, due to the low electrical power and the constant ambient temperature, the temperature of the installed electronic unit 2 in a hearing aid 20 is only exposed to low fluctuations. Therefore, with butt soldering for the electrical connection of conductive tracks of the circuit board 16 and conductive tracks 4 installed on the surface of the plastic molded part 6, there is in particular no cause to fear hairline cracks in the soldered junction, that is in the actual soldering tin 3 or between the soldering tin and conductive track, during normal use of the hearing aid 20. Any common soldering method can be used to establish the electrically conductive connection of circuit board 7 to the injection-molded circuit carrier 1, in particular wave soldering and reflow soldering.

Injection-molded circuit carriers 1 are based on a plastic molded part 6, generally made of a thermoplastic material. However, it is also possible to use elastomers and thermosets and, in the case of multi-component injection molding, different plastics to produce the plastic molded part 6. It is in particular possible for the respective plastics to be provided with metallic additives. Injection molding enables a high degree of freedom in the design of the plastic molded part 6; it can in particular be molded-on as a component of the housing 17 of a cellular telephone or of a hearing aid 20. The free, three-dimensional shaping of injection-molded circuit carriers 1 also makes it possible to connect electronic components functionally to one another on a very small volume. In particular, it is possible to produce molds with recesses in the form of a depression 10 for the introduction of other components, for example a circuit board 7, without difficulty.

The conductive tracks 4 can, for example, be applied to the plastic molded part 6 by hot-foil stamping, mask exposure methods or laser direct structuring. With laser direct structuring, the areas of the surface of the plastic molded part 6 provided with metallic additives which are later to serve as conductive tracks 4 are treated with a laser beam. The conductive tracks 4 are then formed by a copper bath in which a conductive copper film is formed in the areas treated with the laser. This can further be coated with other conductive materials, in particular gold.

In addition, different electronic components can be installed on the injection-molded circuit carrier 1, for example a microphone 5 or a loudspeaker 18, or even coils or integrated circuits 8 as a result of which the electronic unit 2 is compact and has a higher integration level. The electronic components can be attached to the injection-molded circuit carrier 1 means of usual methods, for example by soldering, wire bonding or plug connections.

Figure 2:
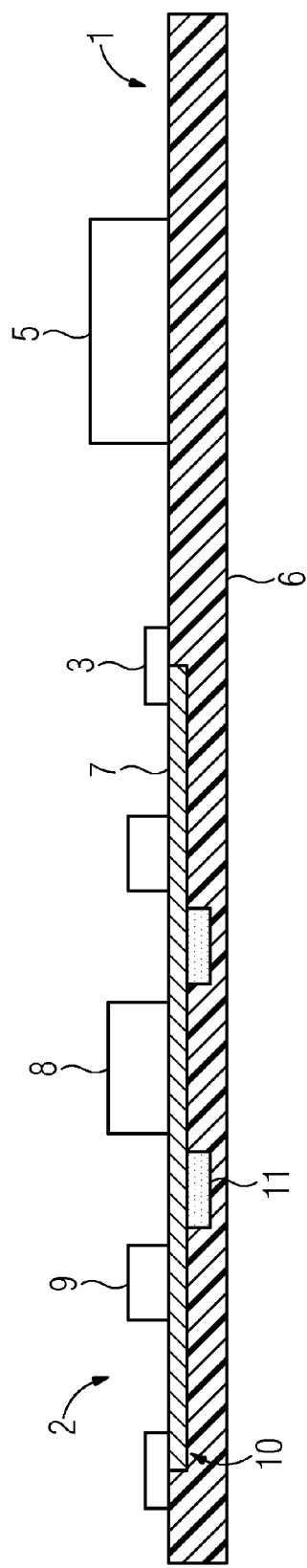
FIG. 2 shows a cross section of the integrated electronic unit in a side view and FIG. 3 shows a cross section through a hearing aid.

FIG. 2 shows a cross section of the electronic unit 2 already depicted in FIG. 1. In the embodiment shown here, the depression 10 in the plastic molded part 6 for the circuit board 7 is designed such that the circuit board 7 fills the depression 10 with an exact fit. This has the advantage that the position of the circuit board 7 is prefixed. In addition, a side of the circuit board 7 is substantially flush with the surrounding surface of the plastic molded part 6 as a result of which the electrical connection of the circuit board 7 with the injection-molded circuit carrier 1 is simplified. As a result, in particular butt soldering, that is without overlapping or penetrating the components to be soldered, is possible without difficulty. The exactly-fitting introduction of the circuit board 7 into the injection-molded circuit carrier 1 means the soldered connection is only exposed to low mechanical stresses and can therefore also be used to fix the circuit board 7.

However, in the embodiment shown here, the circuit board 7 is also connected to the plastic molded part 6 by adhesive 11. Depressions for adhesive 11 are in turn embodied in the depression 10 for the circuit board 7. If these shapes are filled with the correct volume of adhesives, this ensures that only defined parts of the circuit board 7 are in contact with the adhesive 11. Obviously, the bonding of the circuit board 7 can also be performed without the depicted depressions for the adhesive. Instead of adhesive 11, it is also possible to use adhesive strips or mechanical fixing means such as, for example, screws, wires, nails, plug or clamp connections and soldered connections as fixing means. It is also possible to combine different fixing means with one another.

Figure 3:
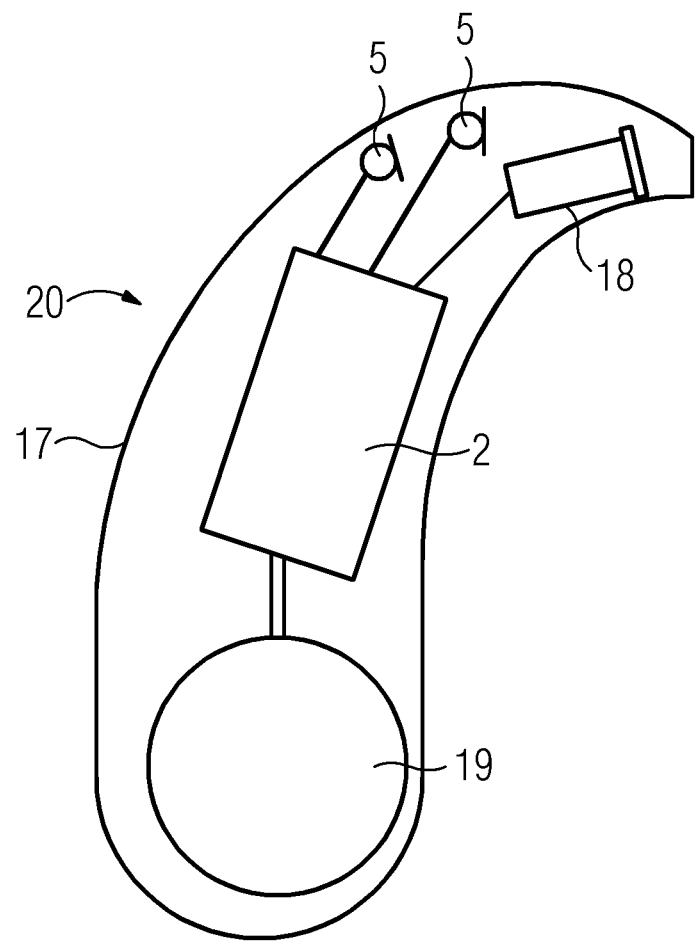

FIG. 3 shows a cross section through a hearing aid 20 embodied as a behind-the-ear hearing aid. The hearing aid 20 comprises an electronic unit 2, which is designed as an amplifier and connected to an energy source in the form of a battery

19 and to two microphones 5 and a loudspeaker 18. The electronic unit 2 amplifies and filters the signals coming from the microphones 5 and routes them to the loudspeaker 18. These electronic components are enclosed by a housing 17.

The hearing aid 20 according to the invention can be an amplifier integrated into an injection-molded circuit carrier 1 and a behind-the-ear hearing aid and an in-the-ear hearing aid. In particular, an in-the-ear hearing aid hearing aid can be a concha device or a so-called "in the canal" (ITC) device or a so-called "completely in the canal" (CIC) device.

Although the invention was illustrated and described in more detail by the preferred exemplary embodiments the invention is not restricted by the disclosed examples and other variations can be derived therefrom by the person skilled in the art without leaving the protective scope of the invention.

The invention claimed is:

1. An integrated electronic unit, comprising:
   a solid plastic molded part forming an injection-molded circuit carrier, said plastic molded part having electrically conductive tracks on a surface thereof;
   a circuit board having a first side, a second side, and at least one conductive track, said circuit board being integrated into said plastic molded part with a surface of said first side of said circuit board lying within said plastic molded part and a surface of said second side of said circuit board being flush with the surface of said plastic molded part;
   wherein the surface of said second side of said circuit board lies in a common plane with said surface of said plastic molded part; and
   wherein said at least one conductive track of said circuit board is connected electrically conductively to at least one conductive track of said injection-molded circuit carrier.

2. The electronic unit according to claim 1, wherein said conductive track of said circuit board and said conductive track of said injection-molded circuit carrier are connected by way of one or both of a soldered connection or a connection via electrically conductive adhesive.

3. The electronic unit according to claim 1, wherein said circuit board is fixed to said plastic molded part by way of a chemical or mechanical fixing means.

4. The electronic unit according to claim 1, which comprises an electronic component attached directly to said plastic molded part and connected electrically conductively to a conductive track of said injection-molded circuit carrier.

5. The electronic unit according to claim 1, which comprises at least one surface-mounted component attached on said circuit board and connected electrically conductively to a conductive track of said circuit board.

6. The electronic unit according to claim 5, wherein said at least one surface-mounted component is an integrated circuit.

7. The electronic unit according to claim 6, wherein said circuit board is formed with the integrated circuit being an amplifier.

8. The electronic unit according to claim 1, which comprises at least one microphone attached directly to said plastic molded part and connected electrically conductively to a conductive track of said injection-molded circuit carrier.

9. The electronic unit according to claim 1, which comprises at least one loudspeaker attached directly to said plastic molded part and connected electrically conductively to a conductive track of said injection-molded circuit carrier.

10. A hearing aid, comprising an electronic unit according to claim 1.

11. The hearing aid according to claim 10, which comprises a hearing aid housing, and wherein said plastic molded part of said injection-molded circuit carrier forms a part of said hearing aid housing.

* * * * *